United States Patent
Maejima et al.

(10) Patent No.: US 9,460,794 B2
(45) Date of Patent: *Oct. 4, 2016

(54) NONVOLATILE SEMICONDUCTOR MEMORY DEVICE

(71) Applicant: KABUSHIKI KAISHA TOSHIBA, Minato-ku (JP)

(72) Inventors: Hiroshi Maejima, Setagaya-ku (JP); Koji Hosono, Fujisawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 62 days.

This patent is subject to a terminal disclaimer.

(21) Appl. No.: 14/507,419

(22) Filed: Oct. 6, 2014

(65) Prior Publication Data

US 2015/0023102 A1    Jan. 22, 2015

Related U.S. Application Data

(63) Continuation of application No. 13/420,767, filed on Mar. 15, 2012, now Pat. No. 8,902,654.

(30) Foreign Application Priority Data

Jun. 16, 2011    (JP) .................................. 2011-133942

(51) Int. Cl.
G11C 11/34    (2006.01)
G11C 16/10    (2006.01)
G11C 16/04    (2006.01)

(52) U.S. Cl.
CPC ............ *G11C 16/10* (2013.01); *G11C 16/0483* (2013.01)

(58) Field of Classification Search
CPC .......................... G11C 16/10; G11C 16/0483
See application file for complete search history.

(56) References Cited

U.S. PATENT DOCUMENTS 6,717,861 B2    4/2004    Jeong et al.
2010/0124116 A1    5/2010    Maeda et al.

*Primary Examiner* — Richard Elms
*Assistant Examiner* — Mohammed A Bashar
(74) *Attorney, Agent, or Firm* — Oblon, McClelland, Maier & Neustadt, L.L.P.

(57) ABSTRACT

In a writing operation, a control circuit raises the voltage of a writing-prohibited bit line among a plurality of bit lines to a first voltage, and thereafter brings the writing-prohibited bit line into a floating state. Then, the control circuit raises the voltage of a writing bit line other than the writing-prohibited bit line to a second voltage. In this way, the control circuit prohibits writing into a memory transistor corresponding to the writing-prohibited bit line. On the other hand, the control circuit executes writing into a memory transistor corresponding to the writing bit line.

16 Claims, 14 Drawing Sheets

In Ordinary Writing Operation a; Selected Memory Units MU(1,1)~(1,n)

b; Non-Selected Memory Units MU(2,1)~(2,n)

c; Memory Units MU(1,n) to MU(2,n) in Non-Selected Memory Blocks MB(2) to MB(m)

Non-Selected Memory Units MU(2,1)
to MU(2,n) in Ordinary Writing Operation $V_{gs} > V_t$
($V_t < 0$)

Non-Selected Memory Units MU(2,1) to MU(2,n) in
Writing Operation According to First Embodiment $V_{gs} < V_t$
($V_t < 0$)

In Writing Operation According to First Embodiment a; Selected Memory Units MU(1,1)~(1,n)

b; Non-Selected Memory Units MU(2,1)~(2,n)

c; Memory Units MU(1,n) to MU(2,n) in Non-Selected Memory Blocks MB(2) to MB(m)

Reading Operation According to First Embodiment a; Selected Memory Units MU(1,1)~(1,n)

b; Non-Selected Memory Units MU(2,1)~(2,n)

c; Memory Units MU(1,n) to MU(2,n) in Non-Selected Memory Blocks MB(2) to MB(m)

In Writing Operation According to Second Embodiment a; Selected Memory Units MU(1,1)~(1,n)

b; Non-Selected Memory Units MU(2,1)~(2,n)

c; Memory Units MU(1,n) to MU(2,n) in Non-Selected Memory Blocks MB(2) to MB(m)

In Writing Operation According to Third Embodiment

Memory Units MU(1,n) to MU(2,n) in
Non-Selected Memory Blocks MB(2) to MB(m)

NONVOLATILE SEMICONDUCTOR MEMORY DEVICE

CROSS REFERENCE TO RELATED APPLICATIONS

This application is a continuation of U.S. application Ser. No. 13/420,767 filed Mar. 15, 2012, and is based on and claims the benefit of priority from prior Japanese Patent Application No. 2011-133942, filed on Jun. 16, 2011, the entire contents of each of which are incorporated herein by reference.

FIELD

Embodiments described herein relate generally to an electrically data rewritable nonvolatile semiconductor memory device.

BACKGROUND

What is considered for a prospective technique for improving the bit density of nonvolatile semiconductor memory devices such as NAND type flash memories is stacking of memory cells because miniaturizing techniques have almost come to their limit. As one example of the stacking technique, a stacked NAND type flash memory using memory transistors configured by vertical transistors is proposed. A stacked NAND type flash memory includes memory strings each configured by a plurality of memory transistors connected in series in the stacking direction, and select transistors provided at both ends of each memory string.

Such a stacked NAND type flash memory requires a control for suppressing erroneous writing into any memory transistors that are not the writing target.

DETAILED DESCRIPTION

A nonvolatile semiconductor memory device according to one embodiment includes a memory cell array, a plurality of memory strings, a plurality of drain-side select transistors, a plurality of source-side select transistors, a plurality of word lines, a plurality of bit lines, a source line, a plurality of drain-side select gate lines, a plurality of source-side select gate lines, and a control circuit. The memory cell array includes a plurality of memory blocks. A plurality of memory strings are provided in each of the plurality of memory blocks, and each memory string is configured by a plurality of electrically-rewritable memory transistors connected in series. One end of each drain-side select transistor is connected to a first end of a memory string. One end of each source-side select transistor is connected to a second end of a memory string. Each of the plurality of word lines is arranged so as to be connected commonly to the gates of a plurality of memory transistors included respectively in a plurality of memory strings provided in each of the plurality of memory blocks. Each of the bit lines is connected to the other end of each of a plurality of drain-side select transistors provided respectively in the plurality of memory blocks. The source line is connected to the other end of each source-side select transistor. Each drain-side select gate line is provided so as to commonly connect the gates of the drain-side select transistors lined up in a first direction. Each source-side select gate line is provided so as to commonly connect the gates of the source-side select transistors lined up in the first direction. The control circuit controls voltages to be applied to the plurality of memory blocks. In a writing operation, the control circuit raises the voltage of a writing-prohibited bit line among the plurality of bit lines to a first voltage, thereafter brings the writing-prohibited bit line into a floating gate. Then, the control circuit raises the voltage of a writing bit line other than the writing-prohibited bit line to a second voltage. In this way, the control circuit prohibits writing into a memory transistor corresponding to the writing-prohibited bit line. On the other hand, the control circuit executes writing into a memory transistor corresponding to the writing bit line.

Embodiments of a nonvolatile semiconductor memory device will now be explained with reference to the drawings.

First Embodiment

Schematic Configuration

Figure 1:
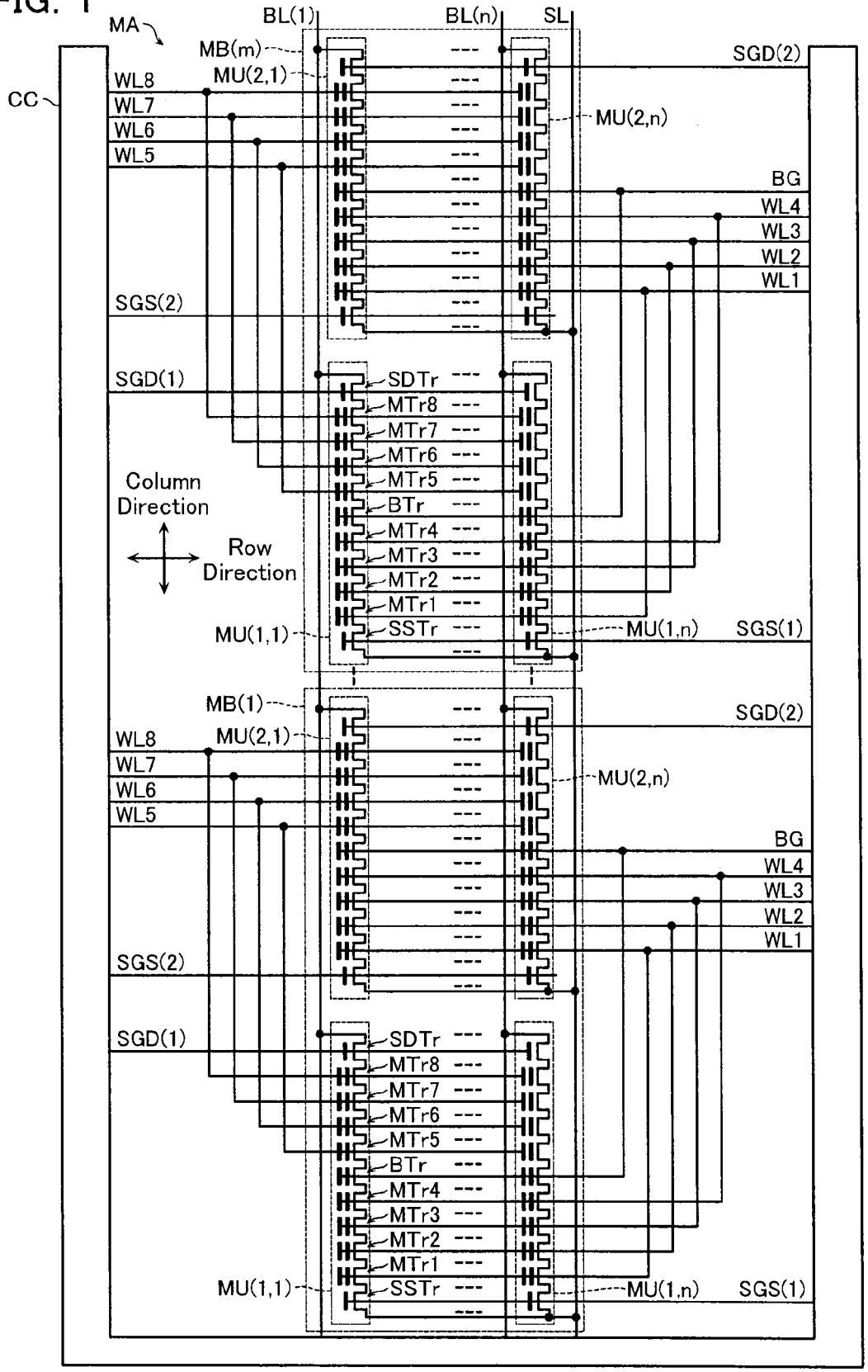
FIG. 1 is a diagram showing a memory cell array MA and a control circuit CC of a nonvolatile semiconductor memory device according to a first embodiment.

As shown in FIG. 1, a memory cell array MA includes n bit lines BL(1) to BL(n), one source line SL, and m memory blocks MB(1) to MB(m). Note that when collectively referring to all the bit lines BL(1) to BL(n) in the following description, they may be denoted as bit lines BL. Likewise, when collectively referring to all the memory blocks ML(1) to ML(m), they may be denoted as memory blocks MB.

The bit lines BL are formed so as to extend in a column direction across a plurality of memory blocks MB and with a certain pitch between them in the row direction.

Each memory block MB includes n rows×2 columns of memory units MU(1,1) to MU(2,*n*) arranged in a matrix. This n-row×2-columns matrix arrangement is a mere example, and the present invention is not limited to this.

Each memory unit MU includes a memory string MS, a source-side select transistor SSTr, and a drain-side select transistor SDTr. In the following description, the memory units MU(1,1) to MU(2,n) may be denoted simply as memory units MU with no specific distinction.

As shown in FIG. 1, a memory string MS is configured by memory transistors MTr1 to MTr8 and a back gate transistor BTr which are connected in series. The memory transistors MTr1 to MTr4 are connected in series and so are the memory transistors MTr5 to MTr8. The back gate transistor BTr is connected between the memory transistor MTr4 and the memory transistor MTr5.

The memory transistors MTr1 to MTr8 retain data by accumulating charges in their charge accumulation layer. The memory transistor MTr1 can be used as a dummy transistor DTr that is not used for data retention. The back gate transistor BTr is brought into a conductive state at least when the memory string MS is selected as an operation target.

In each of the memory blocks MB(1) to MB(m), a word line WL1 to a word line WL8 are connected commonly to the gates of the memory transistors MTr1 to memory transistors MTr8 arranged in the matrix of n rows×2 columns. A back gate line BG is connected commonly to the gates of the n rows×2 columns of back gate transistors BTr.

The drain of the source-side select transistor SSTr is connected to the source of the memory transistor MTr1. The source of the source-side select transistor SSTr is connected to the source line SL. In each memory block MB, one source-side select gate line SGS(1) or SGS(2) is connected commonly to the gates of the n source-side select transistors SSTr that are arranged in line in the row direction. In the following description, the source-side select gate lines SGS(1) and SGS(2) may be collectively referred to as source-side select gate lines SGS with no specific distinction The source of the drain-side select transistor SDTr is connected to the drain of the memory string MS (or to the drain of the memory transistor MTr8). The drain of the drain-side select transistor SDTr is connected to a bit line BL. In each memory block MB, a drain-side gate line SGD(1) or SGD(2) is connected commonly to the gates of the n drain-side select transistors SDTr arranged in line in the row direction. In the following description, the drain-side select gate lines SGD(1) and SGD(2) may be collectively referred to as drain-side select gate lines SGD with no specific distinction.

[Stacked Structure]

Figure 2:
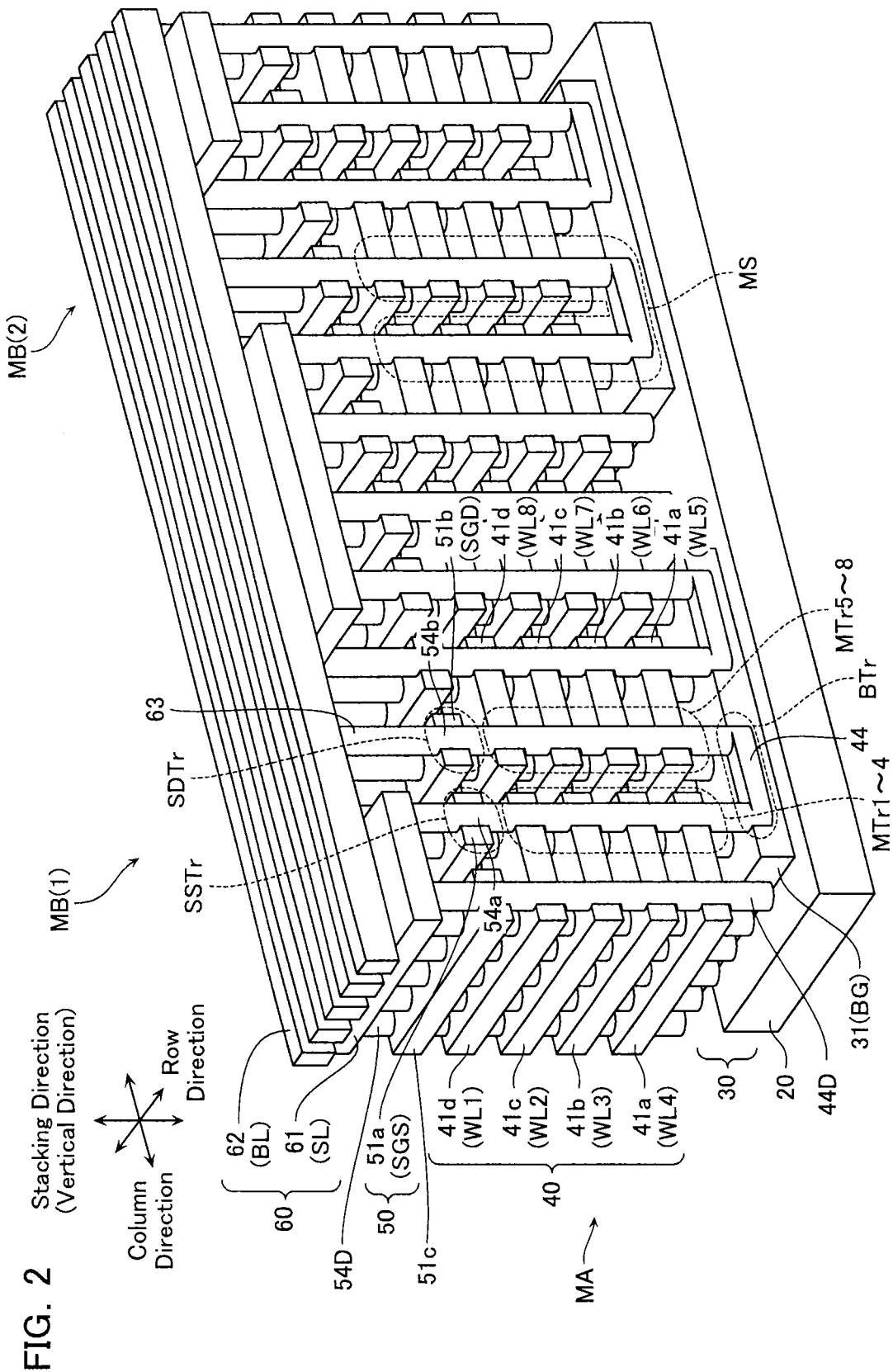
FIG. 2 is a perspective diagram showing a stacked structure of memory blocks MB(1) and MB(2) according to the first embodiment.
Figure 3:
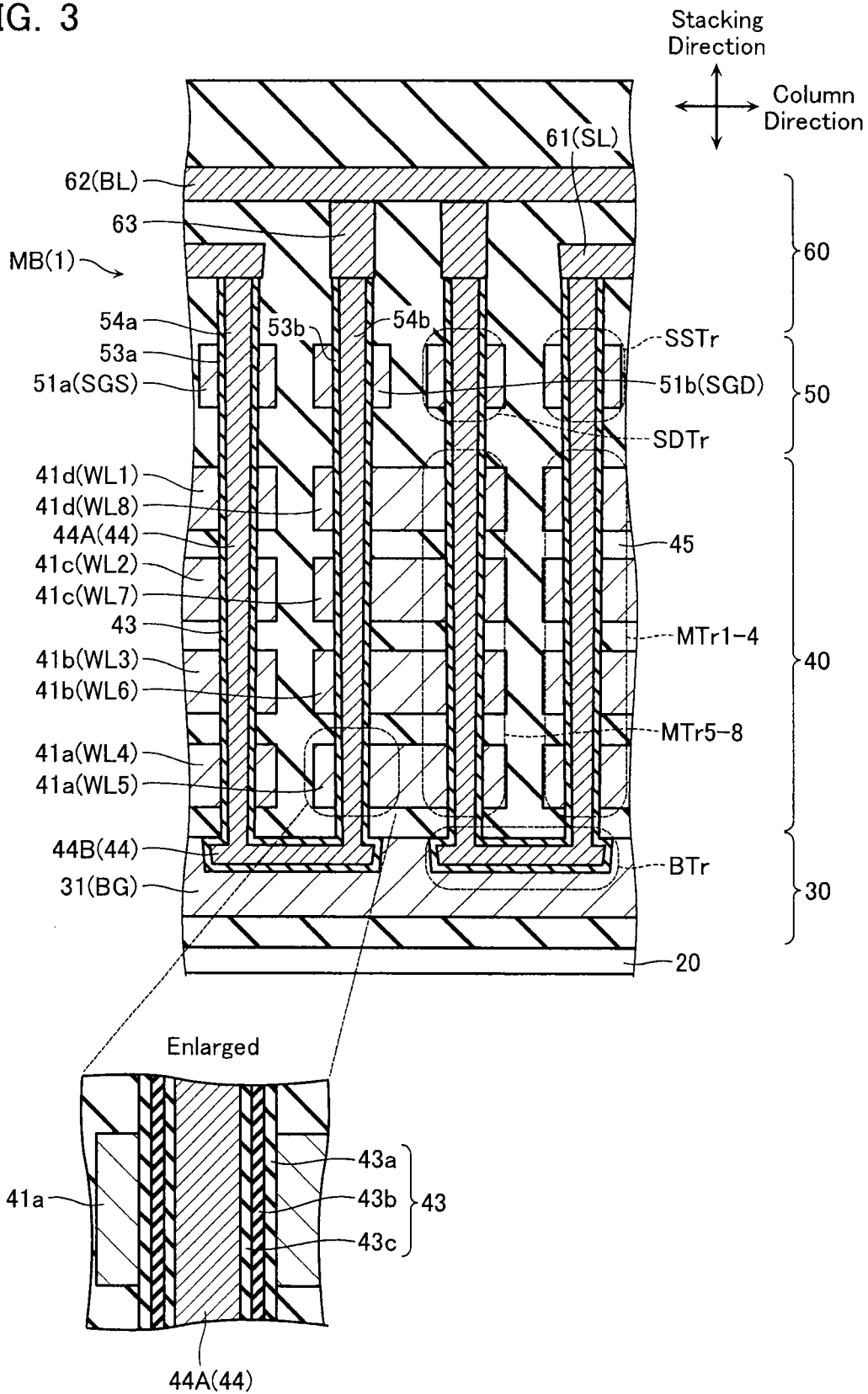
FIG. 3 is a cross-sectional diagram showing a stacked structure of a portion of a memory block MB according to the first embodiment.

As shown in FIG. 2 and FIG. 3, one memory block MB includes a back gate layer 30, a memory layer 40, a select transistor layer 50, and an interconnection layer 60 stacked sequentially above a substrate 20. The back gate layer 30 functions as the back gate transistors BTr. The memory layer 40 functions as the memory transistors MTr1 to MTr8. The select transistor layer 50 functions as the drain-side select transistors SDTr and the source-side select transistors SSTr. The interconnection layer 60 functions as the source line SL and the bit lines BL.

As shown in FIG. 2 and FIG. 3, the back gate layer 30 includes a back gate conductive layer 31. The back gate conductive layer 31 functions as the back gate line BG and the gates of the back gate transistors BTr. The back gate conductive layer 31 is formed so as to spread in a plate shape two-dimensionally in the row and column directions that are parallel with the substrate 20. The back gate conductive layer 31 is made of, for example, polysilicon (poly-Si).

As shown in FIG. 3, the back gate layer 30 includes a memory gate insulating layer 43 and linking semiconductor layers 44B. The memory gate insulating layer 43 is provided between the linking semiconductor layer 44B and the back gate conductive layer 31. The linking semiconductor layers 44B function as the body (channel) of the back gate transistors BTr. The linking semiconductor layers 44B are formed as dug in the back gate conductive layer 31. The linking semiconductor layers 44B are formed in the shape of, when seen from above, generally a rectangle having its longer direction extend in the column direction. The linking semiconductor layers 44B are formed in a matrix arrangement in the row and column direction in one memory block MB. The linking semiconductor layers 44B are made of, for example, polysilicon (poly-Si).

As shown in FIG. 2 and FIG. 3, the memory layer 40 is formed above the back gate layer 30. The memory layer 40 includes four word line conductive layers 41a to 41d. The word line conductive layer 41a functions as a word line WL4 and as the gates of the memory transistors MTr4. The word line conductive layer 41a also functions as a word line WL5 and as the gates of the memory transistors MTr5. Likewise, the word line conductive layer 41b to 41d function as a word line WL3 to WL1 and as the gates of the memory transistors MTr3 to MTr1 respectively. The word line conductive layer 41b to 41d also function as a word line WL6 to WL8 and as the gates of the memory transistors MTr6 to MTr8 respectively.

The word line conductive layers 41a to 41d are stacked one after another through an interlayer insulating layer 45 interposed between a lower layer and an upper layer among them. The word line conductive layers 41a to 41d are formed such that their longer direction extends in the row direction (a direction perpendicular to the sheet of FIG. 3). The word line conductive layers 41a to 41d are made of, for example, polysilicon (poly-Si).

As shown in FIG. 2 and FIG. 3, the memory layer 40 includes a memory gate insulating layer 43, a columnar semiconductor layer 44A, and a dummy semiconductor layer 44D. The memory gate insulating layer 43 is provided between the columnar semiconductor layer 44A and the word line conductive layers 41a to 41d. The columnar semiconductor layer 44A functions as the body (channel) of the memory transistors MTr1 to MTr8. The dummy semiconductor layer 44D is provided as required in relation with the pitch of arrangement, and does not function as the body of the memory transistors MTr1 to MTr8.

The memory gate insulating layer 43 includes a block insulating layer 43a, a charge accumulation layer 43b, and a tunnel insulating layer 43c which are arranged in this order from the side surface of the word line conductive layers 41a to 41d toward the columnar semiconductor layer 44A. The charge accumulation layer 43b is configured to be capable of accumulating charges.

The block insulating layer 43a is formed on the side wall of the word line conductive layers 41a to 41d to have a certain thickness. The charge accumulation layer 43b is formed on the side wall of the block insulating layer 43a to have a certain thickness. The tunnel insulating layer 43c is formed on the side wall of the charge accumulation layer 43b to have a certain thickness. The block insulating layer 43a and the tunnel insulating layer 43c are made of silicon oxide ($SiO_2$). The charge accumulation layer 43b is made of silicon nitride (SiN).

The columnar semiconductor layer 44A is formed so as to penetrate the word line conductive layers 41a to 41d and the interlayer insulating layer 45. The columnar semiconductor layer 44A extends in a direction perpendicular to the substrate 20. A pair of columnar semiconductor layers 44A are formed so as to align with the vicinities of the column-direction ends of the linking semiconductor layer 44B. The columnar semiconductor layer 44A is made of, for example, polysilicon (poly-Si). The dummy semiconductor layer 44D is formed so as to penetrate the word line conductive layers 41a to 41d and the interlayer insulating layer 45. Neither the linking semiconductor layer 44B nor the back gate conductive layer 31 is provided below the dummy semiconductor layer 44D.

In the back gate layer 30 and the memory layer 40, a pair of columnar semiconductor layers 44A and a linking semiconductor layer 44B linking the lower ends of the pair of columnar semiconductor layers 44A constitute a memory semiconductor layer 44 to function as the body (channel) of the memory string MS. The memory semiconductor layer 44 is formed in a U-letter shape when seen in the row direction.

To put the configuration of the back gate layer 40 in other words, the back gate conductive layer 31 is formed so as to surround the side surfaces and lower surface of the linking semiconductor layer 44B through the memory gate insulating layer 43. To put the configuration of the memory layer 40 in other words, the word line conductive layers 41a to 41d are formed so as to surround the side surfaces of the columnar semiconductor layer 44A through the memory gate insulating layer 43.

As shown in FIG. 2 and FIG. 3, the select transistor layer 50 includes a source-side conductive layer 51a, a drain-side conductive layer 51b, and a dummy conductive layer 51c. The source-side conductive layer 51a functions as the source-side select gate line SGS and as the gates of the source-side select transistors SSTr. The drain-side conductive layer 51b functions as the drain-side select gate line SGD and as the gates of the drain-side select transistors SDTr. The dummy conductive layer 51c functions as neither the source-side select gate line SGS nor the drain-side select gate line SGD.

The source-side conductive layer 51a is formed above one of the columnar semiconductor layers 44A constituting the memory semiconductor layer 44. The drain-side conductive layer 51b is formed in the same layer as the source-side conductive layer 51a and above the other of the columnar semiconductor layers 44A constituting the memory semiconductor layer 44. The dummy conductive layer 51c is formed in the same layer as the source-side conductive layer 51a and at a position other than above the columnar semiconductor layers 44A. A plurality of source-side conductive layers 51a, drain-side conductive layers 51b, and dummy conductive layers 51c are formed so as to extend in the row direction and with a certain pitch between them in the column direction. The source-side conductive layer 51a and the drain-side conductive layer 51b are made of, for example, polysilicon (poly-Si).

As shown in FIG. 2 and FIG. 3, the select transistor layer 50 includes a source-side gate insulating layer 53a, a source-side columnar semiconductor layer 54a, a drain-side gate insulating layer 53b, a drain-side columnar semiconductor layer 54b, and a dummy semiconductor layer 54D. The source-side columnar semiconductor layer 54a functions as the body (channel) of the source-side select transistor SSTr. The drain-side columnar semiconductor layer 54b functions as the body (channel) of the drain-side select transistor SDTr.

The source-side gate insulating layer 53a is provided between the source-side conductive layer 51a and the source-side columnar semiconductor layer 54a. The source-side columnar semiconductor layer 54a is formed so as to penetrate the source-side conductive layer 51a. The source-side columnar semiconductor layer 54a is formed in a columnar shape so as to connect with the side surface of the source-side gate insulating layer 53a and the upper surface of one of the pair of columnar semiconductor layers 44A and to extend in a direction perpendicular to the substrate 20. The source-side columnar semiconductor layer 54a is made of, for example, polysilicon (poly-Si).

The drain-side gate insulating layer 53b is provided between the drain-side conductive layer 51b and the drain-side columnar semiconductor layer 54b. The drain-side columnar conductive layer 54b is formed so as to penetrate the drain-side conductive layer 51b. The drain-side columnar semiconductor layer 54b is formed in a columnar shape so as to connect with the side surface of the drain-side gate insulating layer 53b and the upper surface of the other of the pair of columnar semiconductor layers 44A and to extend in a direction perpendicular to the substrate 20. The drain-side columnar semiconductor layer 54b is made of, for example, polysilicon (poly-Si).

The dummy semiconductor layer 54D is formed so as to penetrate the dummy conductive layer 51c. The dummy semiconductor layer 54D is formed in an I-letter shape. The lower surface of the dummy semiconductor layer 54D contacts the upper layer of the dummy semiconductor layer 44D.

The interconnection layer 60 includes a source line layer 61, a bit line layer 62, and a plug layer 63. The source line layer 61 functions as the source line SL. The bit line layer 62 functions as the bit lines BL.

The source line layer 61 is formed so as to contact the upper surface of the source-side columnar semiconductor layer 54a and extend in the row direction. The bit line layer 62 is formed so as to contact the upper surface of the drain-side columnar semiconductor layer 54b through the plug layer 63 and extend in the column direction. The source line layer 61, the bit line layer 62, and the plug layer 63 are made of, for example, a metal such as tungsten, etc.

[Configuration of Control Circuit CC]

Figure 4:
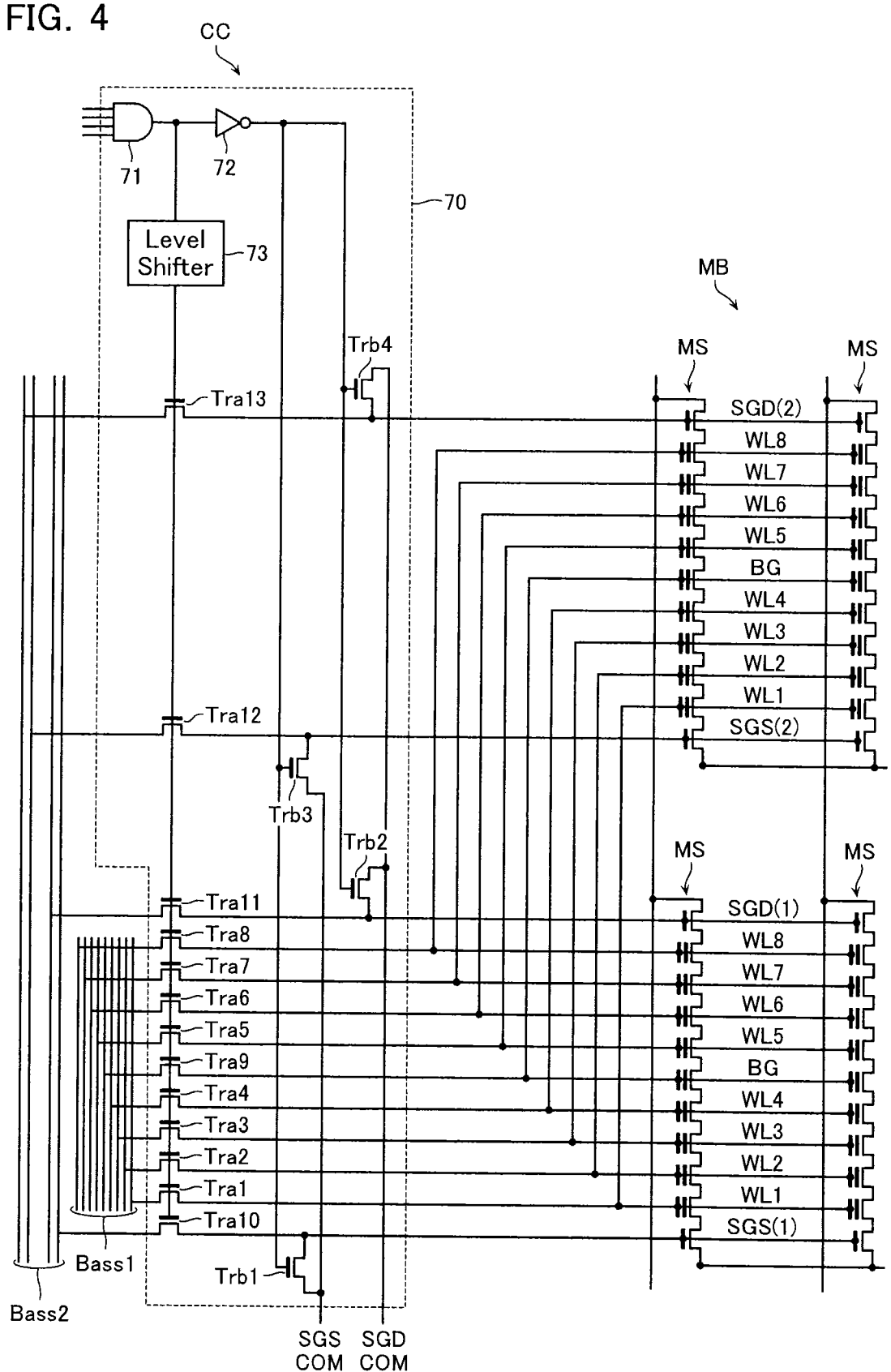
FIG. 4 is a circuit diagram showing a row decoder 70.

Next, the configuration of a control circuit CC will be explained specifically. As shown in FIG. 4, the control circuit CC includes a row decoder 70. As shown in FIG. 4, the word lines WL1 to WL8 and the back gate line BG are shared by a plurality of memory strings MS in order to suppress the area to be occupied by the row decoder 70. It is possible to control each memory string MS independently by controlling the bit lines BL, the drain-side select gate line SGD, and the source-side select gate line SGS.

The row decoder 70 supplies a voltage to the word lines WL1 to WL8, the back gate line BG, the drain-side select gate lines SGD, and the source-side select gate lines SGS through buses Bass1 and Bass2. The row decoder 70 includes an AND circuit 71, an inverter 72, a level shifter 73, first transfer transistors Tra1 to Tra13, and second transfer transistors Trb1 to Trb4 for each memory block MB.

The AND circuit 71 receives a block address. When the row decoder 70 is to control a selected memory block MB, the AND circuit 71 outputs a "H"-level signal based on the block address. On the other hand, when the row decoder 70 is to control a non-selected memory block MB, the AND circuit 71 outputs a "L"-level signal based on the block address.

The gates of the first transfer transistors Tra1 to Tra13 are supplied with the signal output by the AND circuit 71 through the level shifter 73. The first transfer transistors Tra1 to Tra8 are provided between the bas Bass1 and the word lines WL1 to WL8. The first transfer transistor Tra9 is provided between the bus Bass1 and the back gate line BG.

The first transfer transistor Tra10 is provided between the bus Bass2 and the source-side select gate line SGS(1). The first transfer transistor Tra11 is provided between the bus Bass2 and the drain-side select gate line SGD(1). The first transfer transistor Tra12 is provided between the bus Bass2 and the source-side select gate line SGS(2). The first transfer transistor Tra13 is provided between the bus Bass2 and the drain-side select gate line SGD(2).

The gates of the second transfer transistors Trb1 to Trb4 are supplied with a signal output by the AND circuit 71 through the inverter 72. One end of the second transfer transistor Trb1 is connected to the source-side select gate line SGS(1), and the other end thereof is supplied with a signal SGSCOM. One end of the second transfer transistor Trb2 is connected to the drain-side select gate line SGD(1), and the other end thereof is supplied with a signal SGD-COM. One end of the second transfer transistor Trb3 is connected to the source-side select gate line SGS(2), and the other end thereof is supplied with the signal SGSCOM. One end of the second transfer transistor Trb4 is connected to the drain-side select gate line SGD(2), and the other end thereof is supplied with the signal SGDCOM.

Figure 5:
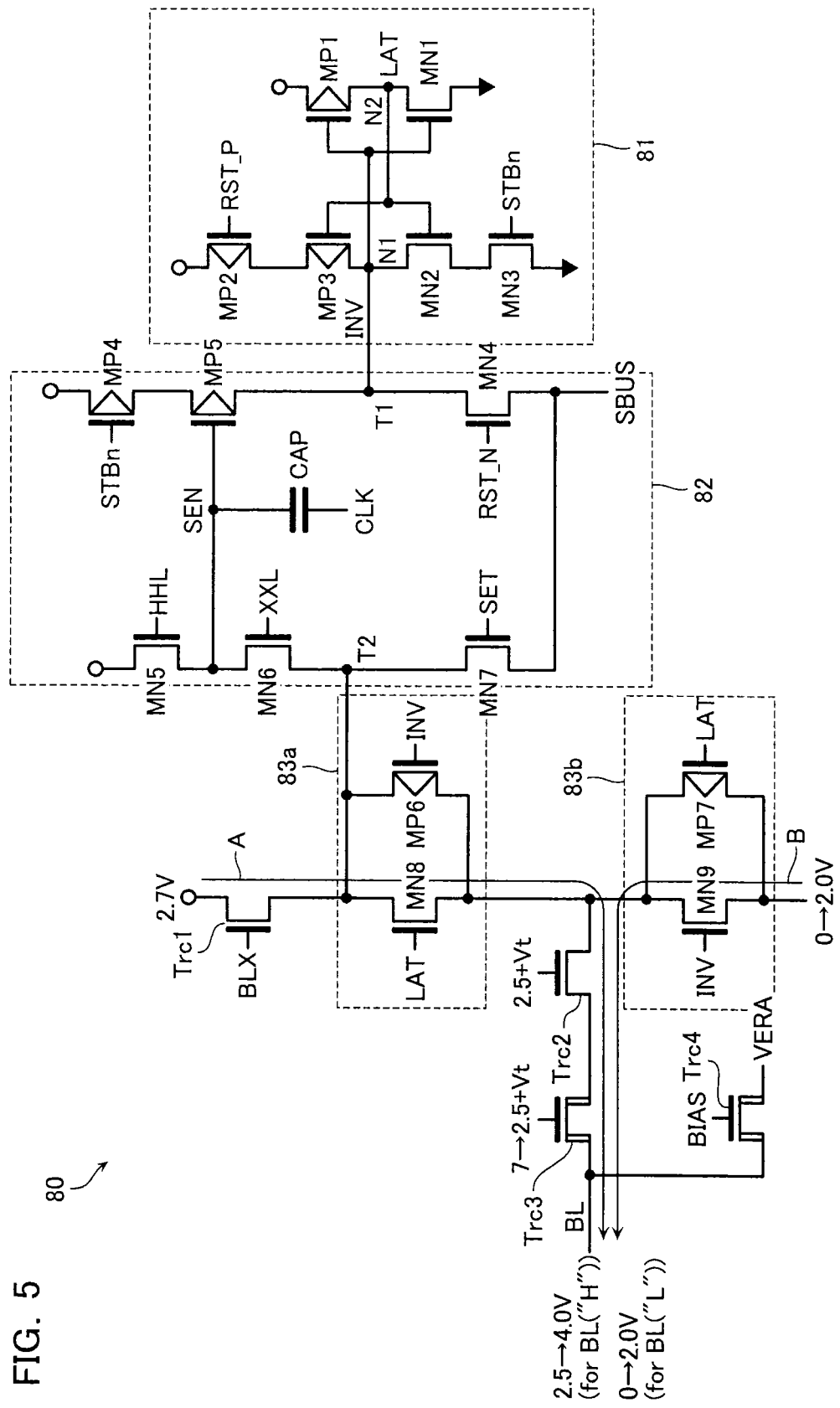
FIG. 5 shows a circuit representing a sense amplifier 80.

Next, a sense amplifier 80 provided in the control circuit CC will be explained with reference to FIG. 5. The sense amplifier 80 controls the voltage of the bit lines BL in a writing operation. As shown in FIG. 5, the sense amplifier 80 includes a latch circuit 81, a differential amplifier 82, switches 83a and 83b, and transfer transistors Trc1 to Trc4.

The latch circuit 81 is connected to a node T1 of the differential amplifier 82. Data "LAT" and data "INV" of the latch circuit 81 are different from a bit line BL to a bit line BL to be controlled, and different voltages are to be applied to different bit lines BL in accordance with these pieces of data.

The latch circuit 81 includes NMOS transistors MN1 to MN3, and PMOS transistors MP1 to MP3. The PMOS transistor MP1 and the NMOS transistor MN1 are connected in series. The PMOS transistor MP2, the PMOS transistor MP3, the NMOS transistor MN2, and the NMOS transistor NM3 are connected in series.

The gate of the PMOS transistor MP1 and the gate of the NMOS transistor MN1 are connected to a node N1 between the PMOS transistor MP3 and the NMOS transistor MN2, and to the node T1 of the differential amplifier 82. The gate of the PMOS transistor MP3 and the gate of the NMOS transistor MN2 are connected to a node N2 between the PMOS transistor MP1 and the NMOS transistor MN1. The gate of the PMOS transistor MP2 is supplied with a reset signal RST_P. The gate of the NMOS transistor MN3 is supplied with a strobe signal STBn. The data "INV" is retained in the node N1, and the data "LAT" is retained in the node N2.

The differential amplifier 82 differentially amplifiers a signal from a bit line BL in a reading operation. The differential amplifier 82 includes NMOS transistors MN4 to MN7, PMOS transistors MP4 and MP5, and a capacitor CAP. The PMOS transistors MP4 and MP5 and the NMOS transistor MN4 are connected in series. The NMOS transistors MN5 to MN7 are connected in series. The node N1 of the latch circuit 81 is connected to the node T1 between the PMOS transistor MP5 and the NMOS transistor MN4, and the switch 83a is connected to a node T2 between the NMOS transistors MN6 and MN7. The sources of the NMOS transistors MN4 and MN7 are supplied with a signal SBUS. One end of the capacitor CAP is connected to a sense node SEN, and the other end thereof is supplied with a clock signal CLK. The sense node SEN is provided between the NMOS transistors MN5 and MN6, and connected to the gate of the PMOS transistor MP5.

The switch 83a becomes conductive or nonconductive in accordance with the data "INV" and "LAT". The switch 83a includes an NMOS transistor MN8 and a PMOS transistor MP6. The NMOS transistor MN8 and the PMOS transistor MP6 are connected in parallel. The gate of the NMOS transistor MN8 is supplied with the data "LAT", and the gate of the PMOS transistor MP6 is supplied with the data "INV". The drain of the NMOS transistor MN8 (or the source of the PMOS transistor MP6) is connected to the node T2 and to the source of the transfer transistor Trc1.

The drain of the transfer transistor Trc1 is applied with a voltage of 2.7 V in a writing operation. The gate of the transfer transistor Trc1 is supplied with a signal BLX.

The switch 83b becomes conductive or nonconductive in accordance with the data "INV" and "LAT". One end of the switch 83b is supplied with a voltage of 2.0V in a writing operation, and the other end thereof is connected to the switch 83a and to the drain of the transfer transistor Trc2. The switch 83b includes an NMOS transistor MN9 and a PMOS transistor MP7. The NMOS transistor MN9 and the PMOS transistor MP7 are connected in parallel. The gate of the NMOS transistor MN9 is supplied with the data "INV", and the gate of the PMOS transistor MP7 is supplied with the data "LAT".

The drain of the transfer transistor Trc2 is connected to the switch 83a (or the source of the NMOS transistor MN8) and to the switch 83b (or the source of the NMOS transistor MN9). The transfer transistor Trc3 is provided between the transfer transistor Tr2 and the bit line BL. The source of the transfer transistor Trc4 is connected between the bit line BL and the transfer transistor Trc3. The drain of the transfer transistor Trc4 is supplied with an erasing voltage VERA, and the gate of the transfer transistor Trc4 is supplied with a bias voltage BIAS.

Next, the mechanism for controlling the voltage of the bit lines BL in a writing operation using the structure of the sense amplifier 80 shown in FIG. 5 will be explained. Here, when executing a writing operation in a memory transistor MTr included in a memory string MS, the bit line BL corresponding to that memory string MS is controlled as a writing bit line BL ("L"). On the other hand, when prohibiting a writing operation in a memory transistor MTr included in a memory string MS, the bit line BL corresponding to that memory string MS is controlled as a writing-prohibited bit line ("H"). The voltage of the writing bit line BL ("L") is controlled to be lower than the voltage of the writing-prohibited bit line ("H").

When the sense amplifier controls the voltage of a writing-prohibited bit line BL ("H"), the pieces of data retained by the latch circuit 81 are set such that "LAT=1 and INV=0". On the other hand, when the sense amplifier 80 controls the voltage of a writing bit line BL ("L"), the pieces of data retained by the latch circuit 81 are set such that "LAT=0 and INV=1".

When controlling the voltage of a writing-prohibited bit line BL ("H"), the switch 83a becomes conductive whereas the switch 83b becomes nonconductive based on "LAT=1 and INV=0". In this state, a voltage of 2.7 V is applied to the drain of the transfer transistor Trc1. Further, a voltage of 2.5 V+Vt is applied to the gate of the transfer transistor Trc2 (where Vt is a threshold voltage). A voltage of 7 V is applied to the gate of the transfer transistor Trc3. As a result, a voltage is transferred from the drain of the transfer transistor Trc1 to the writing-prohibited bit line BL ("H") as shown by a symbol "A" in FIG. 5, and the voltage of the writing-prohibited bit line BL ("H") becomes 2.5 V. After this, the voltage applied to the gate of the transfer transistor Trc3 is lowered from 7 V to 2.5 V+Vt. This brings the writing-prohibited bit line BL ("H") into a floating state when the voltage of the writing-prohibited bit line BL ("H") becomes 2.5 V or higher. After this, the voltage of the writing-prohibited bit line BL ("H") rises to 4 V due to a coupling accompanying a voltage rise in the writing bit line BL ("L") to be described later.

When controlling the voltage of the writing bit line BL ("L"), the switch 83a becomes nonconductive whereas the switch 83b becomes conductive based on "LAT=0 and INV=1". In this state, a voltage of 0 V is applied to one end of the switch 83b. A voltage of 2.5 V+Vt is applied to the gate of the transfer transistor Trc2. A voltage of 7 V is applied to the gate of the transfer transistor Trc3. After this, the voltage applied to the one end of the switch 83b is raised from 0 V to 2.0 V. The voltage applied to the gate of the transfer transistor Trc3 is lowered from 7 V to 2.5 V+Vt. As a result, a voltage is transferred from the one end of the switch 83b to the writing bit line BL ("L") as shown by a symbol "B" in FIG. 5, to raise the voltage of the writing bit line BL ("L") to 2.0 V.

[Writing Operation]

Figure 6:
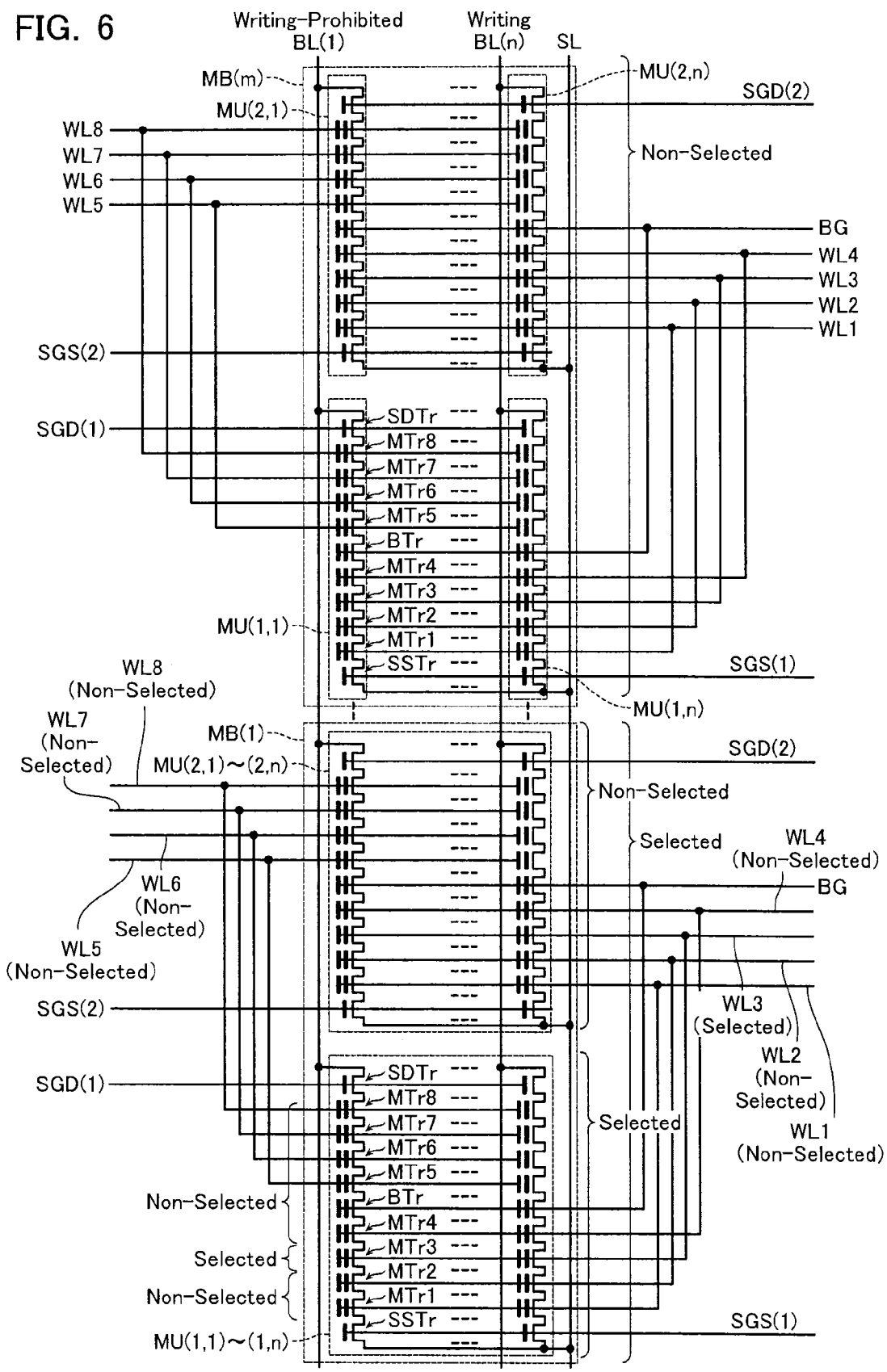
FIG. 6 is a diagram showing a target to be controlled in a writing operation.

Next, the target to be controlled in a writing operation explained below will be explained with reference to FIG. 6. In an example shown in FIG. 6, in a writing operation, one memory block MB(1) is selected from a plurality of memory blocks MB(1) to MB(m). In the selected memory block MB(1), a plurality of memory units MU(1,1) to MU(1,n) arranged in one column are selected from a plurality of memory units MU(1,1) to MU(1,n) and MU(2,1) to MU(2,n) arranged in two columns. Then, in the selected memory units MU(1,1) to MU(1,n), the plurality of memory transistors MTr3 arranged in line in the row direction are selected from the plurality of memory transistors MTr1 to memory transistors MTr8. These selected memory transistors MTr3 arranged in line in the row direction are the target of the writing operation.

In the writing operation, writing is executed in a selected memory transistor MTr3 included in any of the selected memory units MU(1,1) to MU(1,n) that is connected to a writing bit line BL ("L"), and thereby the threshold voltage of that selected memory transistor MTr3 is shifted (writing of "0"). On the other hand, writing is prohibited in the selected memory transistor MTr3 included in any of the selected memory units MU(1,1) to MU(1,n) (or memory strings MS) that is connected to a writing-prohibited bit line BL ("H"), and thereby the original threshold voltage of that selected memory transistor MTr3 is maintained (writing of "1").

The non-selected memory blocks MB(2) to MB(m) other than the selected memory block MB(1) are not the writing target. The non-selected memory units MU(2,1) to MU(2,n) in the selected memory block MB(1) other than the selected memory units MU(1,1) to MU(1,n) are not the writing target.

Figure 7:
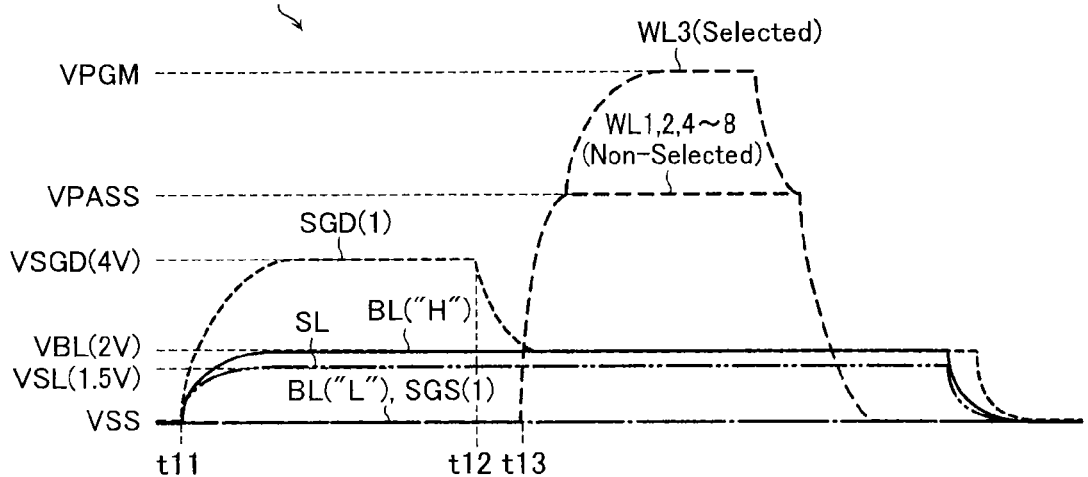
FIG. 7 is a timing chart of an ordinary writing operation.
Figure 7:
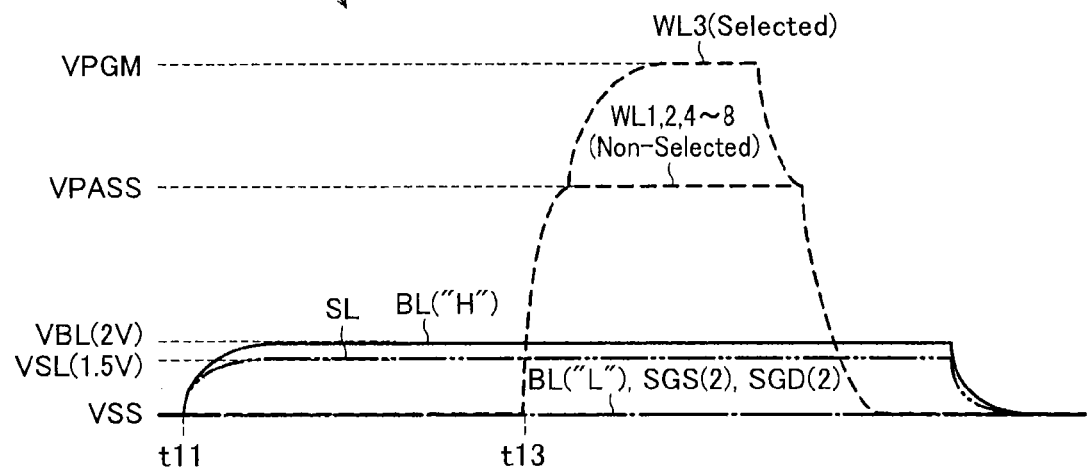
Figure 7:
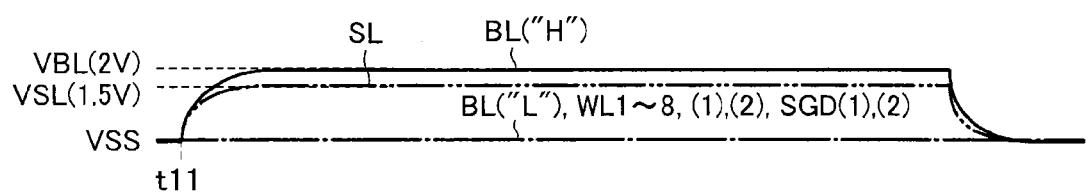

Next, an ordinary writing operation will be explained with reference to FIG. 7. FIG. 7 is a timing chart showing an ordinary writing operation of a nonvolatile semiconductor memory device. "a" of FIG. 7 shows the voltages of the interconnection lines connected to the selected memory units MU(1,1) to MU(1,n). "b" of FIG. 7 shows the voltages of the interconnection lines connected to the non-selected memory units MU(2,1) to MU(2,n). "c" of FIG. 7 shows the voltages of the interconnection lines connected to the memory units MU(1,1) to MU(2,n) in a non-selected memory block MB.

As shown in FIG. 7, in an ordinary writing operation, at a timing t11, the voltage of a writing-prohibited bit line BL ("H") is raised to a voltage VBL (2 V), whereas the voltage of a writing bit line BL ("L") is maintained at a voltage VSS (0 V). Further, at the timing t11, the voltage of the drain-side select gate line SGD(1) connected to the selected memory units MU(1,1) to MU(1,n) is raised to a voltage VSGD (4 V). As a result, in the selected memory units MU(1,1) to MU(1,n), the drain-side select transistor SDTr that is connected to the writing-prohibited bit line BL ("H") becomes conductive, and the body of the corresponding memory string MS (the memory transistors MTr1 to MTr8) is precharged through the writing-prohibited bit line BL ("H"). Furthermore, at the timing t11, the voltage of the source line SL is raised to a voltage VSL (1.5 V).

Next, at a timing t12, the voltage of the drain-side select gate line SGD(1) is lowered to the voltage VBL (2 V). Then, at a timing t13, the selected word line WL3 is raised to a program voltage VPGM (VPGM>VPASS), and the non-selected word lines WL1, WL2, and WL4 to WL8 are raised to a pass voltage VPASS (VPASS>4 V). The program voltage VPGM is a voltage for injecting charges into the charge accumulation layer of a memory transistor MTr. The pass voltage VPASS is a voltage for making a memory transistor MTr conductive regardless of the data retained in the memory transistor MTr.

In the selected memory units MU(1,1) to MU(1,n), the drain-side select transistor SDTr connected to the writing bit line BL ("L") becomes conductive under the control described above. As a result, writing is executed with a high voltage applied to the charge accumulation layer of the selected memory transistor MTr3 included in any of the selected memory units MU(1,1) to MU(1,n) that is connected to the writing bit line BL ("L").

On the other hand, in the selected memory units MU(1,1) to MU(1,n), the drain-side select transistor SDTr connected to the writing-prohibited bit line BL ("H") is maintained nonconductive (or cut off). That is, the body of the memory string MS (the memory transistors MTr1 to MTr8) corresponding to the writing-prohibited bit line BL ("H") is brought into a floating state. Hence, when the program voltage VPGM is applied to the gate of the selected memory transistor MTr3, the voltage of the body of the selected memory transistor MTr3 rises due to coupling. Hence, writing is prohibited with no high voltage applied to the charge accumulation layer of the selected memory transistor MTr3.

At the timings t11 to t13 described above, the voltages of the drain-side select gate line SGD(2) and source-side select gate line SGS(2) connected to the non-selected memory units MU(2,1) to MU(2,n) are maintained at the voltage VSS. Further in the non-selected memory blocks MB(2) to MB(m), the word lines WL1 to WL8, the source-side select gate lines SGS(1) and SGS(2), and the drain-side select gate lines SGD(1) and SGD(2) are maintained at the voltage VSS (0 V).

The above explanation of FIG. 7 assumes a case when the threshold voltages of the drain-side select transistors SDTr and source-side select transistors SSTr are both positive values. In this case, the ordinary writing operation of FIG. 7 causes the drain-side select transistors SDTr and source-side select transistors SSTr in the non-selected memory units MU(2,1) to MU(2,n) to become nonconductive, and hence writing is not executed in the memory transistors MTr3 in the non-selected memory units MU(2,1) to MU(2,*n*).

Figure 8:
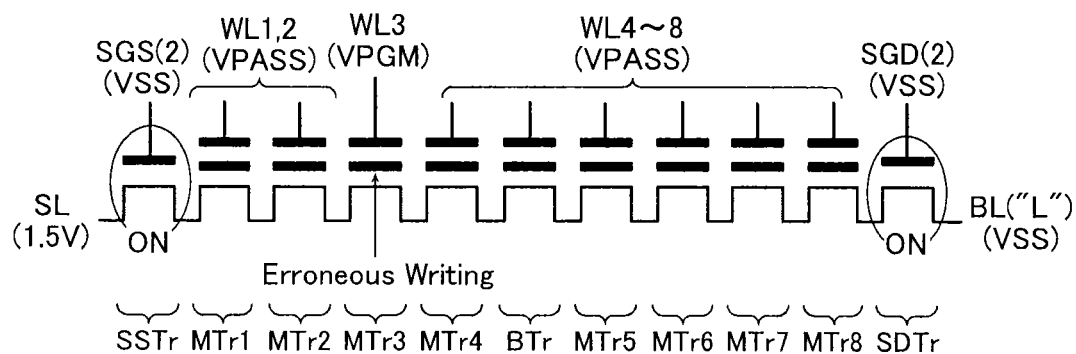
FIG. 8 is a diagram showing a conductive state of non-selected memory units MU(2,1) to MU(2,*n*) in an ordinary writing operation.

However, when the threshold voltages Vt of the drain-side select transistors SDTr and source-side select transistors SSTr are both negative values, a problem occurs in such non-selected memory units MU(2,1) to MU(2,*n*) that are connected to writing bit lines ("L") if the ordinary writing operation described above is employed. Specifically, in the non-selected memory units MU(2,1) to MU(2,*n*), the gate-source voltage Vgs of the drain-side select transistors SDTr and source-side select transistors SSTr becomes higher than the negative threshold voltage Vt, as shown in FIG. 8. As a result, in the non-selected memory units MU(2,1) to MU(2,*n*), the drain-side select transistors SDTr and the source-side select transistors SSTr become conductive (ON), causing erroneous writing into the memory transistors MTr3.

Figure 9:
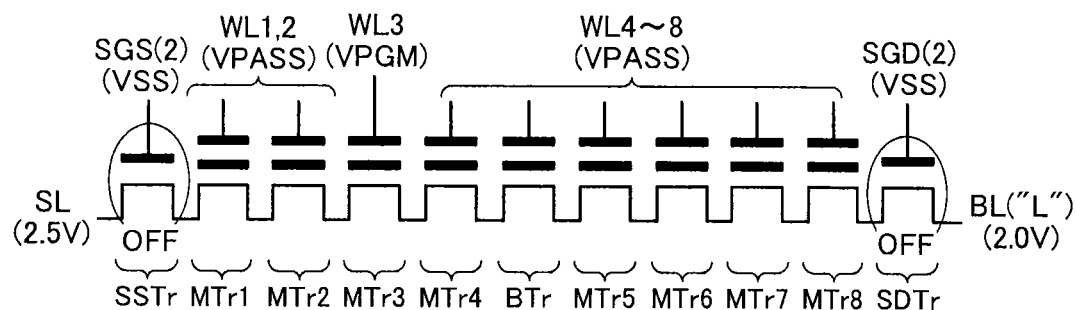
FIG. 9 is a diagram showing a conductive state of non-selected memory units MU(2,1) to MU(2,*n*) in a writing operation according to the first embodiment.

To deal with this problem, in the writing operation of the first embodiment, as shown in FIG. 9, the voltage of the bit lines BL and the voltage of the source line SL are raised to voltages higher than the voltages to which they are raised in the ordinary writing operation. Therefore, in the first embodiment, even if the drain-side select transistors SDTr and source-side select transistors SSTr have a negative threshold voltage Vt, their gate-source voltage Vgs is lower than the negative threshold voltage Vt. Hence, in the non-selected memory units MU(2,1) to MU(2,*n*), the drain-side select transistors SDTr and the source-side select transistors SSTr become nonconductive (OFF), and hence erroneous writing into the memory transistors MTr3 is prevented. Specifically, in the first embodiment, the voltage of a writing bit line BL ("L") and the voltage of a writing-prohibited bit line BL ("H") are raised to positive voltages that are higher than the absolute value of the negative threshold voltage of the drain-side select transistors SDTr and source-side select transistors SSTr.

Figure 10:
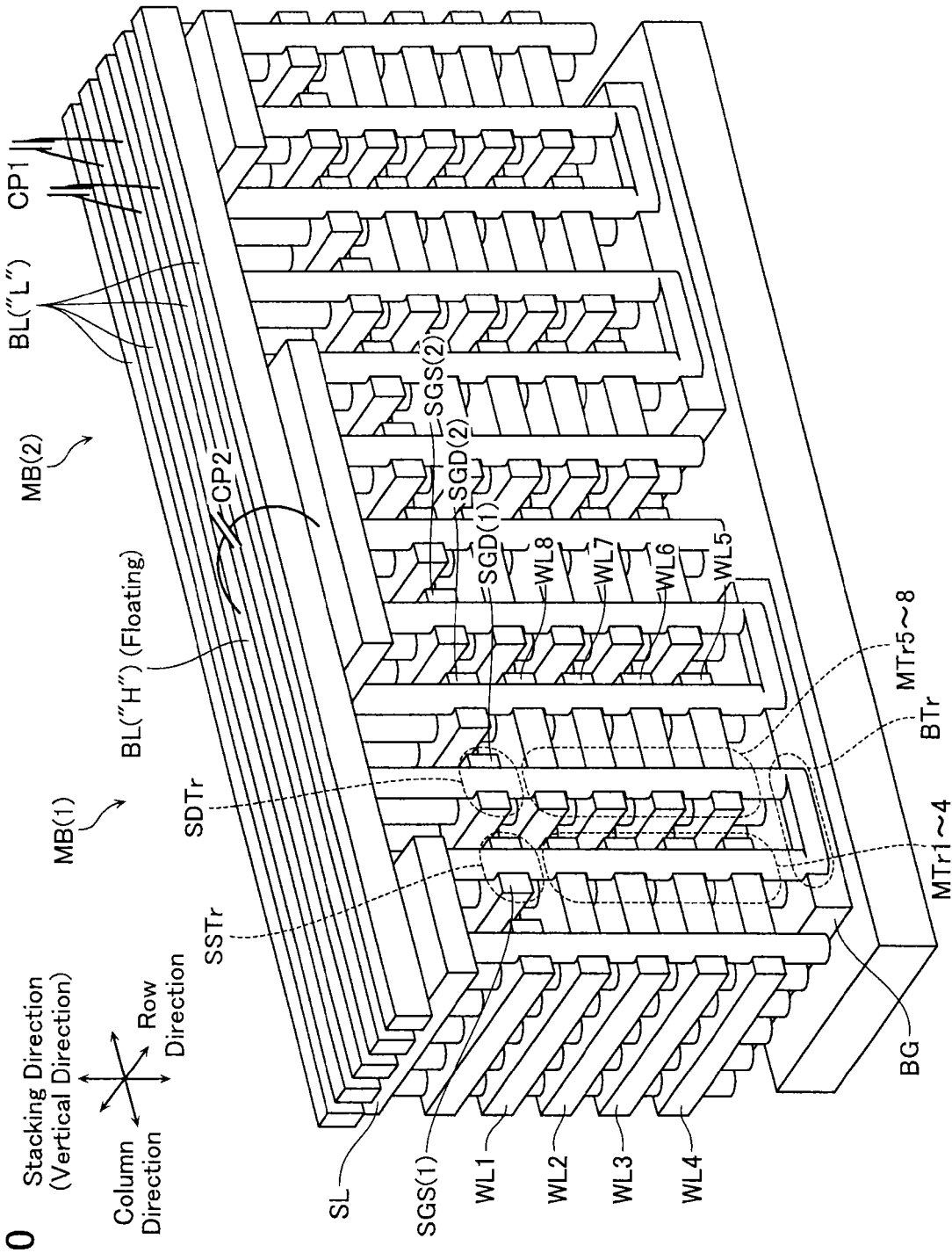
FIG. 10 is a diagram showing couplings CP1 and CP2 according to the first embodiment.

Meanwhile, a boost circuit is required to raise the voltage of the bit lines BL, which brings about the problem of the area to be occupied by the boost circuit. Hence, in the first embodiment, couplings CP1 and CP2 are utilized to raise the voltage of a writing-prohibited bit line BL ("H"), as shown in FIG. 10. In this way, in the first embodiment, the occupation area required for the boost circuit can be reduced.

Specifically, in the first embodiment, in a writing operation, the voltage of a writing-prohibited bit line BL ("H") is raised, then the writing-prohibited bit line BL ("H") is brought into a floating state, and then the voltage of a writing bit line BL ("L") is raised. This causes a coupling CP1 between the writing bit line BL ("L") and the writing-prohibited bit line BL ("H") as shown in FIG. 10 to thereby enable the voltage of the writing-prohibited bit line BL ("H") to be raised further in the first embodiment. Further, after the writing-prohibited bit line BL ("H") is brought into a floating state, the voltage of the source line SL is raised. This causes a coupling CP2 between the source line SL and the writing-prohibited bit line BL ("H") as shown in FIG. 10 to thereby enable the voltage of the writing-prohibited bit line BL ("H") to be raised further in the first embodiment.

Here, the plurality of bit lines BL cause coupling easily with each other because as shown in FIG. 10, they are arranged at a certain pitch in the row direction with an interlayer insulating layer (unillustrated) interposed between them. That is, the plurality of bit lines BL are provided at positions at which they cause coupling with adjoining bit lines BL.

Further, the source line SL causes coupling easily with the bit lines BL because as shown in FIG. 10, it is located immediately under the bit lines BL with an interlayer insulating layer (unillustrated) interposed between them. That is, the source line SL is provided at a position at which it causes coupling with the bit lines BL.

A writing-prohibited bit line BL ("H") causes the largest coupling with an adjoining writing bit line BL ("L"). A writing-prohibited bit line BL ("H") also causes coupling with the source line SL. A writing-prohibited bit line BL ("H") also cause a small coupling with a writing bit line BL ("L") next to the adjoining the bit line.

Figure 11:
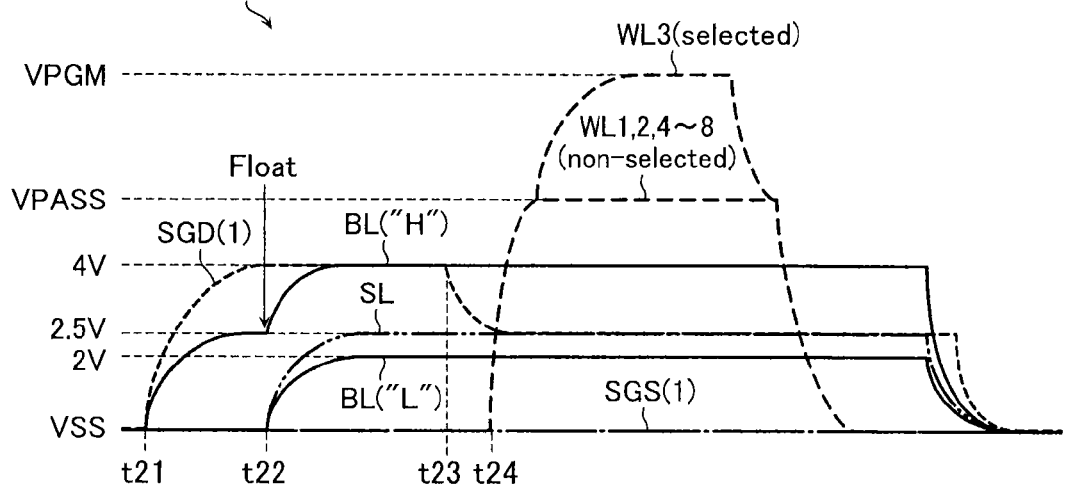
FIG. 11 is a timing chart of a writing operation according to the first embodiment.
Figure 11:
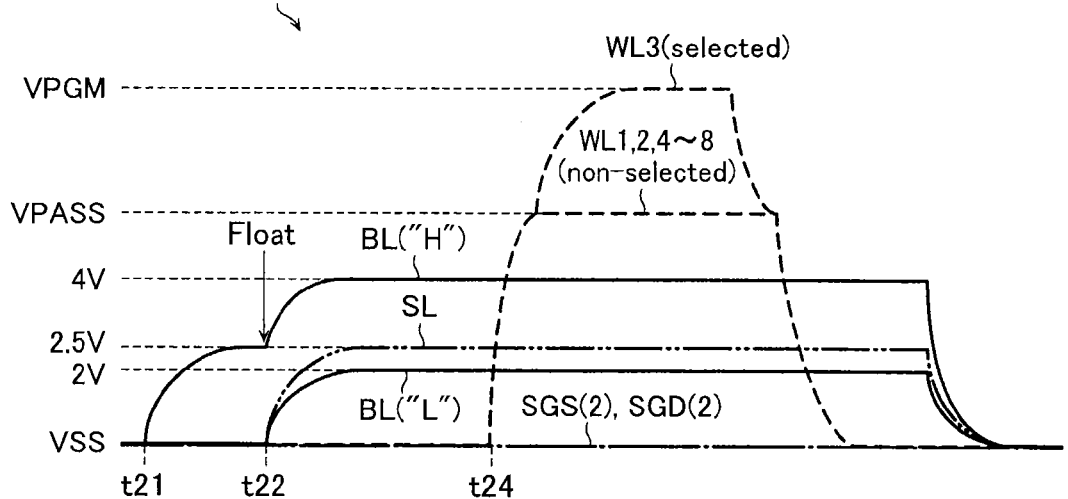
Figure 11:
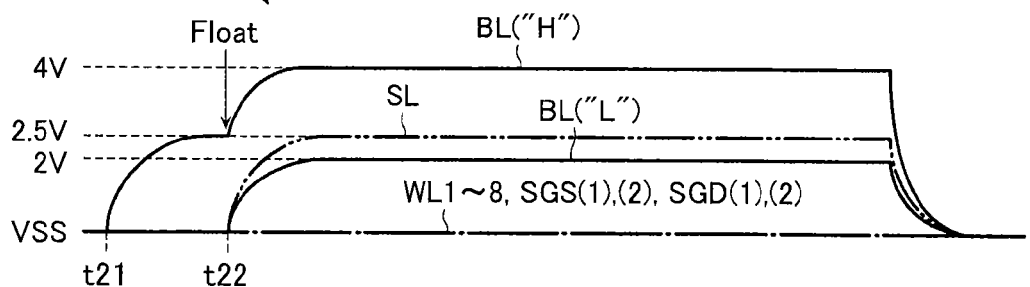

Next, the writing operation according to the first embodiment will be explained in detail with reference to FIG. 11. FIG. 11 is a timing chart of the writing operation according to the first embodiment. "a" of FIG. 11 shows the voltages of the interconnection lines connected to the selected memory units MU(1,1) to MU(1,*n*). "b" of FIG. 11 shows the voltages of the interconnection lines connected to the non-selected memory units MU(2,1) to MU(2,*n*). "c" of FIG. 11 shows the voltages of the interconnection lines connected to the memory units MU(1,1) to MU(2,*n*) in the non-selected memory blocks MB(2) to MB(m).

As shown in "a" to "c" of FIG. 11, first, at a timing t21, the voltage of a writing-prohibited bit line BL ("H") is raised to 2.5 V. Also at the timing t21, the voltage of the drain-side select gate line SGD(1) connected to the selected memory units MU(1,1) to MU(1,*n*) is raised to 4 V. As a result, in the selected memory units MU(1,1) to MU(1,*n*), the drain-side select transistor SDTr connected to the writing-prohibited bit line BL ("H") becomes conductive, and the body of the corresponding memory string MS (the memory transistors MTr1 to MTr8) is pre-charged through the writing-prohibited bit line BL ("H").

Then, at a timing t22, the writing-prohibited bit line BL ("H") is brought into a floating state. Meanwhile, at the timing t22, the voltage of a writing bit line BL ("L") is raised to 2 V, and the voltage of the source line SL is raised to 2.5 V. As a result, the voltage of the writing-prohibited bit line BL ("H") rises to 4 V by coupling with the writing bit line BL ("L") and the source line SL.

Next, at a timing t23, the drain-side select gate line SGD(1) is lowered to 2.5 V. Then, at a timing t24, the non-selected word lines WL1, WL2, and WL4 to WL8 are raised to the pass voltage VPASS. The selected word line WL3 is raised to the program voltage VPGM.

In the selected memory units MU(1,1) to MU(1,*n*), the drain-side select transistor SDTr connected to the writing bit line BL ("L") becomes conductive under the control described above. As a result, writing is executed with a high voltage applied to the charge accumulation layer of the selected memory transistor MTr3 included in any of the selected memory units MU(1,1) to MU(1,*n*) that is connected to the writing bit line BL ("L").

On the other hand, in the selected memory units MU(1,1) to MU(1,*n*), the drain-side select transistor SDTr connected to the writing-prohibited bit line BL ("H") is maintained nonconductive (or cut off). That is, the body of the memory string MS (the memory transistors MTr1 to MTr8) corresponding to the writing-prohibited bit line BL ("H") is brought into a floating state. Hence, when the program voltage VPGM is applied to the gate of the selected memory transistor MTr3, the voltage of the body of the selected memory transistor MTr3 rises due to coupling. Hence, writing is prohibited with no high voltage applied to the charge accumulation layer of the selected memory transistor MTr3.

At the timings t21 to t24 described above, the drain-side select gate line SGD(2) and source-side select gate line SGS(2) connected to the non-selected memory units MU(2, 1) to MU(2,n) are maintained at the voltage VSS. In the writing operation of the first embodiment, through the steps of the timings t21 to t24 described above, the voltages of the bit lines BL and source line SL can be set higher than in the ordinary writing operation. Therefore, in the first embodiment, it is possible to maintain the drain-side select transistors SDTr and source-side select transistors SSTr in the non-selected memory units MU(2,1) to MU(2,n) at a non-conductive state (or a cut-off state) without fail and hence to prevent erroneous writing into the memory transistors MTr3.

Further, in the non-selected memory blocks MB(2) to MB(m), the voltage of the word lines WL1 to WL3, the voltage of the source-side select gate lines SGS(1) and SGS(2), and the voltage of the drain-side select gate lines SGD(1) and SGD(2) are maintained at the voltage VSS. Because of this, the memory transistors MTr in the non-selected memory blocks MB(2) to MB(m) are not the writing target.

[Reading Operation]

Figure 12:
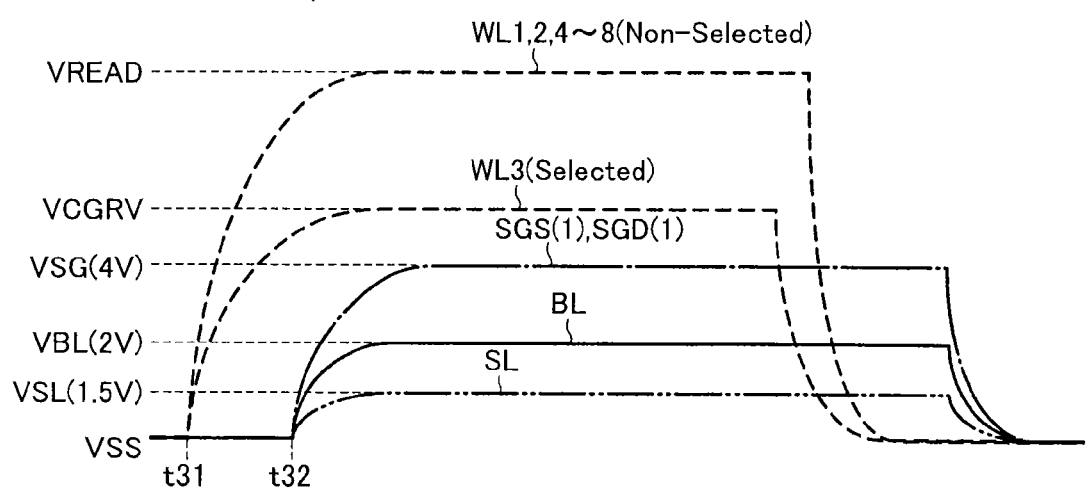
FIG. 12 is a timing chart of a reading operation according to the first embodiment.
Figure 12:
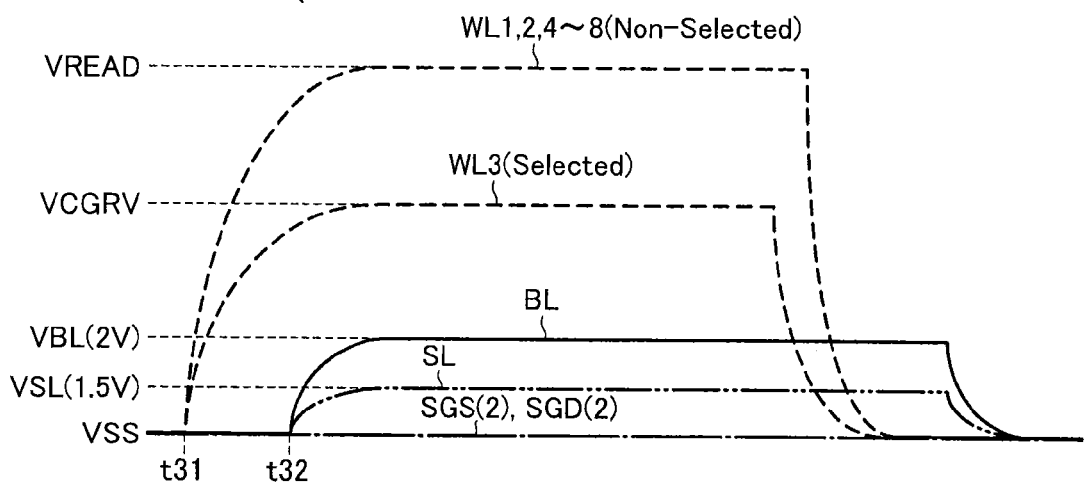
Figure 12:
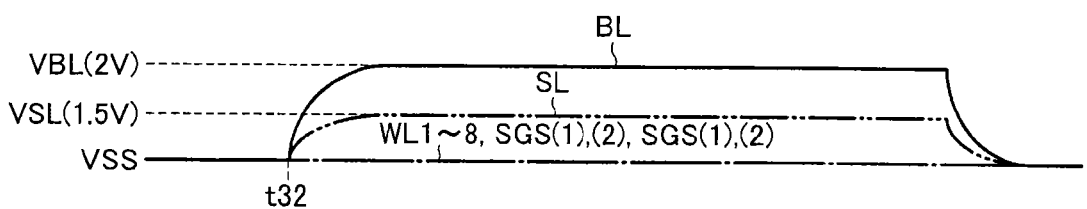

Next, a reading operation according to the first embodiment will be explained with reference to FIG. 12. FIG. 12 is a timing chart of a reading operation according to the first embodiment. In the present embodiment, the target of the reading operation is selected memory transistors MTr3 included in selected memory units MU(1,1) to MU(1,n) in a selected memory block MB(1) as in the writing operation.

First, at a timing t31, the voltage of the selected word line WL3 is raised to a voltage VCGRV (VCGRV>4 V), and the voltage of the non-selected word lines WL1, WL2, and WL4 to WL8 is raised to a reading voltage VREAD (VREAD>VCGRV). The voltage VCGRV is a voltage for making a memory transistor MTr conductive or nonconductive depending on the data retained by that memory transistor MTr. The reading voltage VREAD is a voltage for making a memory transistor MTr conductive regardless of the data retained by that memory transistor MTr.

After the timing t31, at a timing t32, the source-side select gate line SGS(1) and the drain-side select gate line SGD(1) are raised to a voltage VSG (4 V). The bit lines BL(1) to BL(n) are raised to a voltage VBL (2 V), and the source line SL is raised to a voltage VSL (1.5 V).

This causes currents to flow from the bit lines BL(1) to BL(n) to the source line SL in accordance with the data in the selected memory transistors MTr3. With these currents detected, the data in the selected memory transistors MTr3 are read out.

Second Embodiment

Configuration

Next, a nonvolatile semiconductor memory device according to the second embodiment will be explained. The second embodiment has the same configuration as the first embodiment. Therefore, explanation about the configuration of the second embodiment will not be provided.

[Writing Operation]

Figure 13:
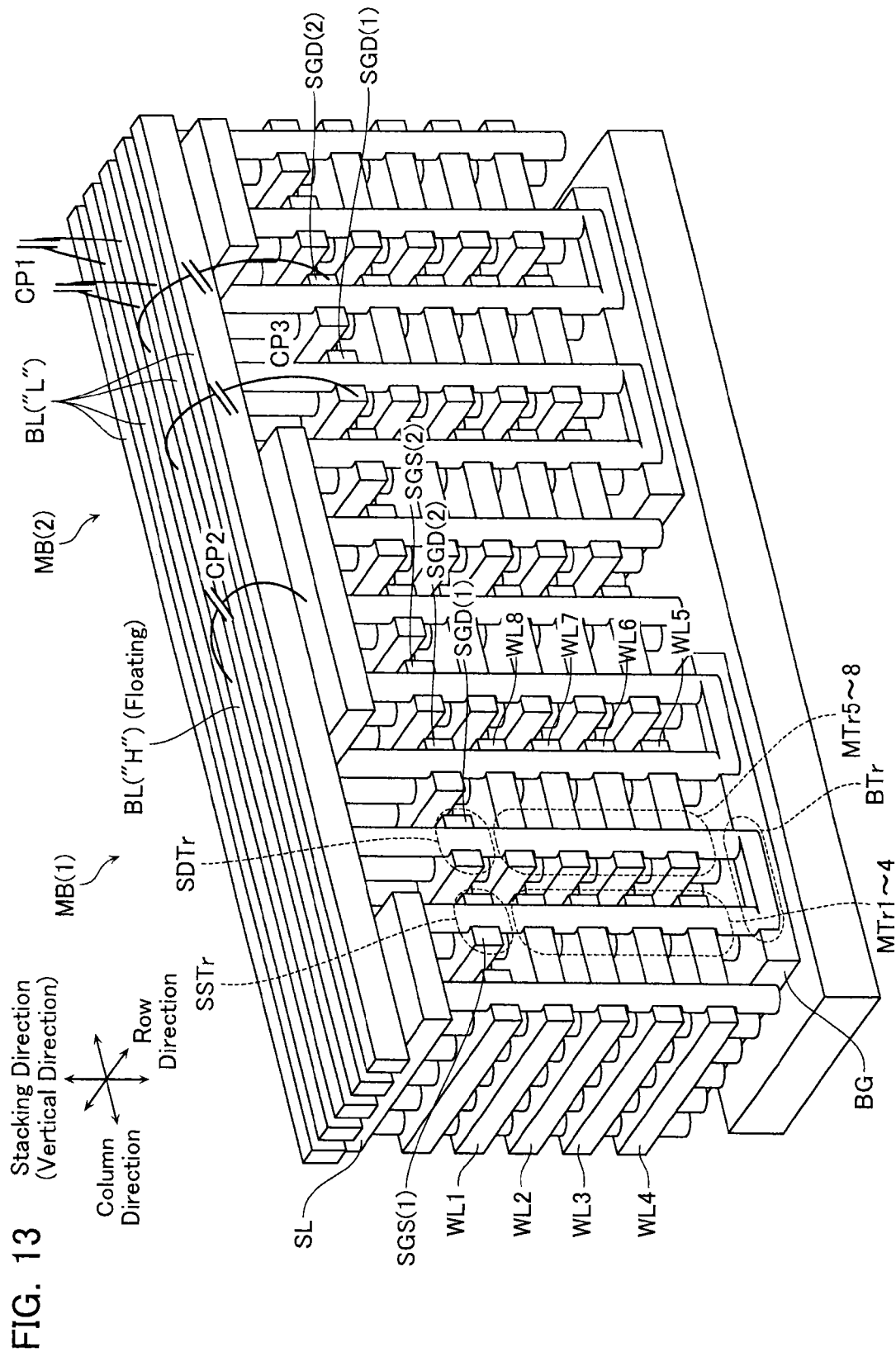
FIG. 13 is a diagram showing couplings CP1, CP2, and CP3 according to a second embodiment.

Next, a writing operation according to the second embodiment will be explained with reference to FIG. 13. In the second embodiment, the voltage of a writing-prohibited bit line BL ("H") is raised by way of a coupling CP3 in addition to the couplings CP1 and CP2, as shown in FIG. 13. The coupling CP3 is caused by raising the voltage of the drain-side select gate lines SGD in the non-selected memory blocks MB(2) to MB(m). Here, the drain-side select gate lines SGD cause coupling easily with the bit lines BL because they are located immediately under the bit lines BL with an interlayer insulating layer (unillustrated) interposed between them. That is, the drain-side select gate lines SGD are provided at positions at which they cause coupling with the bit lines BL.

Figure 14:
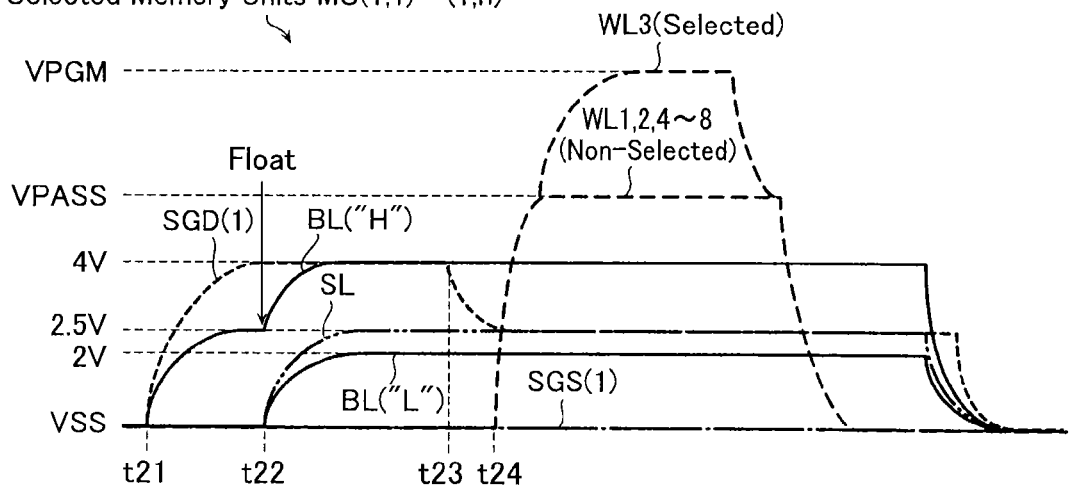
FIG. 14 is a timing chart of a writing operation according to the second embodiment.
Figure 14:
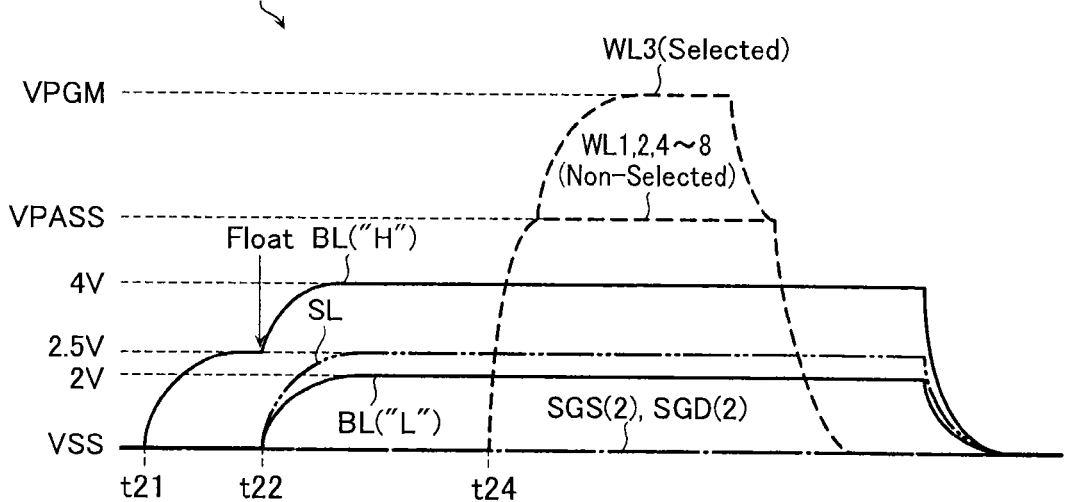
Figure 14:
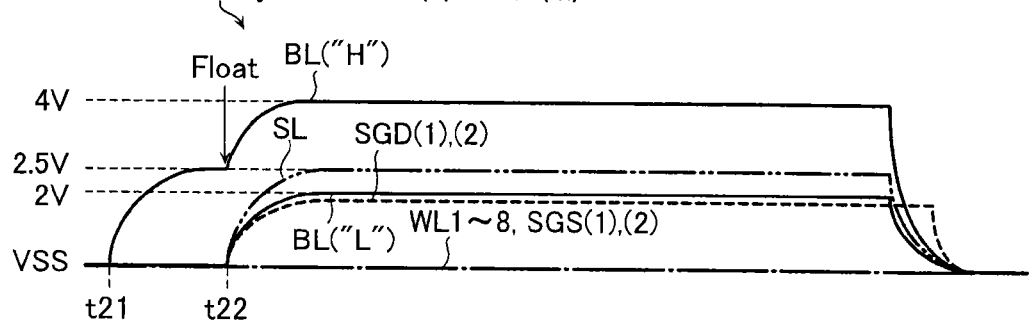

Next, the writing operation according to the second embodiment will be explained in detail with reference to FIG. 14. As shown in FIG. 14, in the second embodiment, at a timing t22, the voltage of the drain-side select gate lines SGD(1) and SGD(2) in the non-selected memory blocks MB(2) to MB(m) is raised to 2 V. The controls other than this are the same as the first embodiment, and hence explanation about them will not be provided.

In the second embodiment, the control described above causes a coupling between the drain-side select gate lines SGD and a writing-prohibited bit line BL ("H") to thereby enable the voltage of the writing-prohibited bit line BL ("H") to be raised even more quickly than in the first embodiment.

Third Embodiment

Configuration

Next, a nonvolatile semiconductor memory device according to the third embodiment will be explained. The third embodiment has the same configuration as the first embodiment. Therefore, explanation about the configuration of the third embodiment will not be provided,

[Writing Operation]

Figure 15:
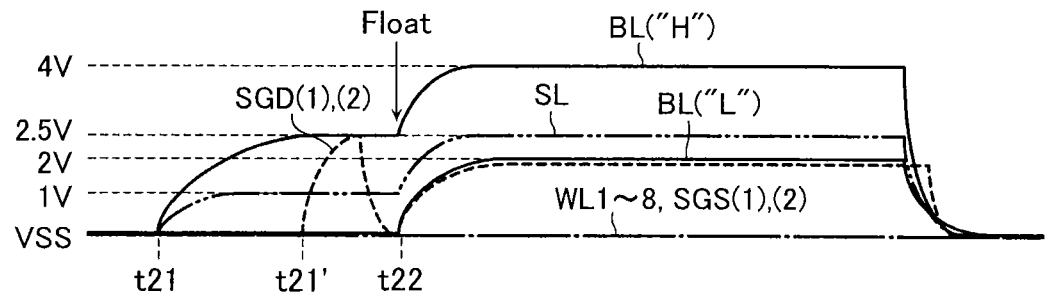
FIG. 15 is a timing chart of a writing operation according to a third embodiment.

Next, a writing operation according to the third embodiment will be explained with reference to FIG. 15. As shown in FIG. 15, the third embodiment is different from the first and second embodiments only in the control on the source line SL and on the drain-side select gate lines SGD in the non-selected memory blocks MB(2) to MB(m) in the writing operation. Hence, explanation with reference to FIG. 15 will only be about the voltages of the interconnection lines connected to the memory units MU(1,1) to MU(2,n) in the non-selected memory blocks MB(2) to MB(m).

In the third embodiment, as shown in FIG. 15, at a timing t21, the voltage of the source line SL is raised to 1 V. This makes the source-side select transistors SSTr nonconductive without fail. Then, at a timing t21' between the timing t21 and a timing t22, the voltage of the drain-side select gate lines SGD in the non-selected memory blocks MB(2) to MB(m) is raised to 2.5 V for one pulse. This makes the drain-side select transistors SDTr in the non-selected memory blocks MB(2) to MB(m) conductive for a certain time. Hence, in the non-selected memory blocks MB(2) to MB(m), the bodies of the memory transistors MTr1 to MTr8 are charged through writing-prohibited bit lines BL ("H") for a certain time. The controls from the subsequent timing t22 are the same as the second embodiment, and explanation will not be provided about them.

In the third embodiment, the above control causes the bodies of the memory transistors MTr1 to MTr8 in the non-selected memory blocks MB(2) to MB(m) to be charged through the writing-prohibited bit lines BL ("H") at the timing t22, which allows the drain-side select transistors SDTr to be set to a nonconductive state from the timing t22. Hence, in the third embodiment, it is possible to suppress discharges from the writing-prohibited bit lines BL ("H") to the memory transistors MTr1 to MTr8 in the non-selected memory blocks MB(2) to MB(m). Namely, the third embodiment is more suitable than the second embodiment in maintaining the voltage of the writing-prohibited bit lines BL ("H") at a high voltage.

Other Embodiments

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in the embodiments described above, the writing-prohibited bit lines BL ("H") are raised to ultimately become 4 V by coupling. However, as other embodiments, once the writing-prohibited bit lines BL ("H") are raised to 4 V, they may be connected to the sense amplifier 80 again such that their voltage is raised by an unillustrated boost circuit or the like.

What is claimed is:

1. A nonvolatile semiconductor memory device, comprising:
   a first memory string including a first memory cell;
   a second memory string including a second memory cell;
   a first bit line electrically connected to one end of the first memory string;
   a second bit line electrically connected to one end of the second memory string;
   a word line electrically connected to gates of the first memory cell and the second memory cell; and
   a control circuit configured to perform a writing operation, the writing operation including a first operation, a second operation, and a third operation,
   the control circuit being configured to apply a first voltage to the first bit line in the first operation, the control circuit being configured to apply a second voltage to the second bit line in the first operation,
   a voltage of the first bit line is changed to a third voltage in the second operation after the first operation, the control circuit being configured to apply a fourth voltage to the second bit line in the second operation, the third voltage being higher than the fourth voltage, the third voltage being higher than the first voltage, the fourth voltage being higher than the second voltage,
   the control circuit being configured to apply a program voltage to the word line in the third operation after the second operation.

2. The nonvolatile semiconductor memory device according to claim 1,
   wherein in the writing operation, the control circuit is configured to set the first bit line into a floating state in the second operation, and then the control circuit is configured to raise a voltage of a source line to a fifth voltage in the second operation.

3. The nonvolatile semiconductor memory device according to claim 1, further comprising:
   a first block including the first memory string, the first memory string including a first select transistor; and
   a second block including the second memory string, the second memory string including a second select transistor,
   wherein the control circuit is configured to apply a sixth voltage to a gate of the first select transistor in the second operation and the control circuit is configured to apply a seventh voltage to a gate of the second select transistor in the second operation, and the sixth voltage is higher than the seventh voltage.

4. The nonvolatile semiconductor memory device according to claim 3,
   wherein the control circuit makes the second select transistor turn on and then turn off in the first operation.

5. The nonvolatile semiconductor memory device according to claim 3,
   wherein the first select transistor has a negative threshold voltage, the second select transistor has a negative threshold voltage, and
   the first voltage, the third voltage, and the fourth voltage are positive voltages.

6. The nonvolatile semiconductor memory device according to claim 3,
   wherein the first select transistor includes:
      a first semiconductor layer extending in a direction perpendicular to the substrate;
      a first gate insulating layer surrounding surface of the first semiconductor layer; and
      a first conductive layer surrounding the first gate insulating layer.

7. The nonvolatile semiconductor memory device according to claim 3,
   wherein the second select transistor includes:
      a second semiconductor layer extending in a direction perpendicular to the substrate;
      a second gate insulating layer surrounding surface of the second semiconductor layer; and
      a second conductive layer surrounding the second gate insulating layer.

8. The nonvolatile semiconductor memory device according to claim 1,
   wherein each of the first and second memory strings includes:
      a third semiconductor layer including a first columnar portion, a second columnar portion, and a first portion, both the first columnar portion and the second columnar portion extending in a direction perpendicular to a substrate, the first portion linking lower ends of first columnar portion and the second columnar portion;
      a charge accumulation layer surrounding a surface of the columnar portion; and
      a third conductive layer surrounding the surface of the columnar portion.

9. A nonvolatile semiconductor memory device, comprising:
   a first memory string including a first memory cell;
   a second memory string including a second memory cell;
   a first bit line electrically connected to one end of the first memory string;
   a second bit line electrically connected to one end of the second memory string;
   a word line electrically connected to gates of the first memory cell and the second memory cell; and
   a control circuit configured to perform a writing operation, the writing operation including a first operation, a second operation, and a third operation, the control circuit being configured to apply a first voltage to the first bit line in the first operation, the control circuit being configured to make the first bit line floating after the first operation, the control circuit being configured to apply a second voltage to the second bit line in the first operation, the control circuit being configured to apply a third voltage to the second bit line in the second operation, the third voltage being higher than the second voltage, the control circuit being configured to apply a program voltage to the word line in the third operation after the second operation.

10. The nonvolatile semiconductor memory device according to claim 9,
wherein the third voltage is zero voltage and a voltage of the first bit line is changed from the first voltage by applying the third voltage to the second bit line.

11. The nonvolatile semiconductor memory device according to claim 9, further comprising:
a first block including the first memory string, the first memory string including a first select transistor; and
a second block including the second memory string, the second memory string including a second select transistor,
wherein the control circuit is configured to apply a fourth voltage to a gate of the first select transistor in the second operation and the control circuit is configured to apply a fifth voltage to a gate of the second select transistor in the second operation, and the fourth voltage is higher than the fifth voltage.

12. The nonvolatile semiconductor memory device according to claim 11,
wherein the control circuit makes the second select transistor turn on and then turn off in the first operation.

13. The nonvolatile semiconductor memory device according to claim 11,
wherein the first select transistor has a negative threshold voltage, the second select transistor has a negative threshold voltage, and
the first voltage, the third voltage, and the fourth voltage are positive voltages.

14. The nonvolatile semiconductor memory device according to claim 11,
wherein the first select transistor includes:
a first semiconductor layer extending in a direction perpendicular to the substrate;
a first gate insulating layer surrounding a surface of the first semiconductor layer; and
a first conductive layer surrounding the first gate insulating layer.

15. The nonvolatile semiconductor memory device according to claim 11,
wherein the second select transistor includes:
a second semiconductor layer extending in a direction perpendicular to the substrate;
a second gate insulating layer surrounding a surface of the second semiconductor layer; and
a second conductive layer surrounding the second gate insulating layer.

16. The nonvolatile semiconductor memory device according to claim 9,
wherein each of the first and second memory strings includes:
a third semiconductor layer including a first columnar portion, a second columnar portion, and a first portion, both the first columnar portion and the second columnar portion extending in a direction perpendicular to a substrate, the first portion linking lower ends of first columnar portion and the second columnar portion;
a charge accumulation layer surrounding a surface of the columnar portion; and
a third conductive layer surrounding the surface of the columnar portion.

* * * * *